United States Patent [19]

Horwitz et al.

[11] 4,056,792
[45] Nov. 1, 1977

[54] WIDEBAND DIODE SWITCHED MICROWAVE PHASE SHIFTER NETWORK

[75] Inventors: Stuart S. Horwitz, Baltimore, Md.; Walter R. Jost, Richfield, Minn.

[73] Assignee: Westinghouse Electric Corporation, Pittsburgh, Pa.

[21] Appl. No.: 630,872

[22] Filed: Nov. 11, 1975

[51] Int. Cl.$^2$ .............. H01P 1/18; H01P 1/15; H01P 5/12; H03K 17/74

[52] U.S. Cl. .............. 333/31 R; 307/320; 333/7 D

[58] Field of Search .............. 333/29, 31 R, 31 A, 333/7 R, 7 D; 343/854; 307/208, 320

[56] References Cited

U.S. PATENT DOCUMENTS

| | | |
|---|---|---|
| 3,131,367 | 4/1964 | Pitts et al. .............. 333/31 R |
| 3,192,530 | 6/1965 | Small .............. 333/31 R X |
| 3,568,097 | 3/1971 | Hyltin .............. 333/7 D |
| 3,710,145 | 1/1973 | Williamson et al. .............. 343/854 X |

*Primary Examiner*—Alfred E. Smith
*Assistant Examiner*—Marvin Nussbaum
*Attorney, Agent, or Firm*—C. F. Renz

[57] ABSTRACT

A diode switched microwave phase shifter network consists of a series of alternate path, phase increment stages. The diodes which control direction of current through the alternate paths are all commonly poled so that a single D.C. diode forward biased source applied between the ends of the network operates all the diodes. The alternate paths of each phase increment stage are controlled by the series connection therein of a collector-emitter internal circuit of a low frequency transistor.

18 Claims, 1 Drawing Figure

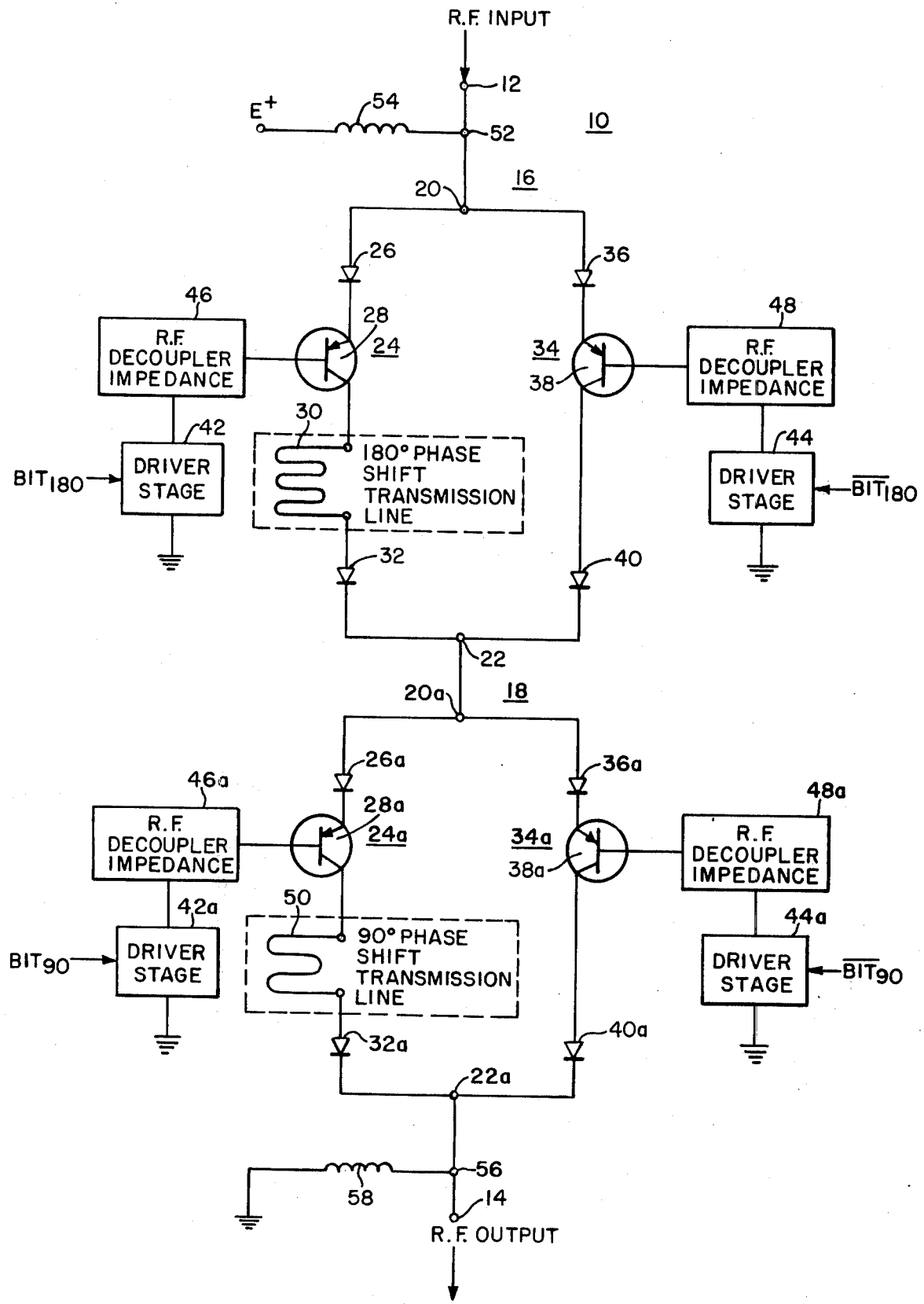

WIDEBAND DIODE SWITCHED MICROWAVE PHASE SHIFTER NETWORK

BACKGROUND OF THE INVENTION

1. Field of the Invention

The present invention relates to diode switched circuits for providing an adjustable phase shift network, of the type constructed by miniaturized circuits utilizing microstrip delay line structures and with phase increment adjustments performed by the switching of diode "chips" mounted to the delay line structure in a manner of high density packaging. More particularly, the invention relates to an improved electrical design of such a network.

2. Description of the Prior Art

In diode switched phase shifters, of the type referred to, changes in phase shift are accomplished by altering the D.C. current distribution to the diodes in the network. These diodes present either short circuits or open circuits to the R.F. energy, depending upon whether they are conducting or non-conducting. In the prior art, the diodes are from a D.C. standpoint, individual diodes and controlled by individual driver circuits which provide their forward bias. Another known practice, where the functions of several diodes are identical, is for such several diodes to be biased from the same driver source, with the diodes connected in parallel relative to this source. A typical configuration of the driver has the D.C. forward bias voltage applied across the diode or diodes through a collector-emitter path of a transistor switch. An individual network of voltage source and transistor switch is applied to each diode or each of several diodes having the same function.

In applications where source power is at a premium such as in satellites, or where power dissipation can cause severe thermal problems such as in compact airborne radars, these prior art approaches dissipate relatively high amounts of power. This is because a minimum of 5 volts for the diode forward bias source is desirable for reasons of regulation and power supply efficiency. The required diode current is a function of the diodes, and the total average power required in a network will be:

$$P = N \cdot I \cdot V$$

where:
 $I$ = required diode current;
 $N$ = average number of diodes conducting; and
 $V$ = source voltage.

In a typical case the diode current would be 100 ma. For a 10 diode circuit the power source requirement would be 5 watts. Accordingly, there has been a continuing effort to obtain reductions in the power consumption required for operation of a diode switched phase shifter networks.

In addition to the above discussed needs for achieving lower power dissipation in such phase shifter networks, there is a continuing need for providing such networks which have wider bandpass characteristics, and lower R.F. insertion losses.

SUMMARY OF THE INVENTION

A diode switched phase shifter network of the type in which diodes alternately direct currents through zero-length paths or transmission line paths having predetermined electrical lengths is provided. All the diodes of a path are in series with a common polarity relative to a D.C. diode forward bias source applied between the input and output ends of the network. Each alternate path has a pair of diodes with the collector-emitter internal circuit path of a transistor therebetween. In the case of the alternate path containing a transmission line section, the transmission line section is also connected in series in the path between the two diodes. Binary voltage control signals for controlling the direction of current through a pair of alternate paths are applied to the bases of the transistors in the path. The normal and the complemented signal, respectively, are applied to the bases of one and another of the transistors.

BRIEF DESCRIPTION OF THE DRAWING

The single FIGURE of the drawing is partially an electrical schematic and partially a block diagram schematic of a phase shifter network in accordance with the present invention.

DESCRIPTION OF THE PREFERRED EMBODIMENT

Referring now to the single FIGURE of the drawing, a diode switched phase shifter network 10 has an R.F. input terminal 12 and an R.F. output terminal 14. The input applied to terminal 12 is an R.F. signal which is to be subjected to selectively controllable phase shift increments which are selectively introduced by a 180° increment shift stage 16 and a 90° increment shift stage 18. Selective control of the magnitude of phase shift introduced by stages 16 and 18 is provided by binary control signals $BIT_{180}$, $\overline{BIT}_{180}$ for stage 16 and binary signal $BIT_{90}$, $\overline{BIT}_{90}$ for stage 18, as symbolically indicated on the drawing. For simplicity of explanation, network 10 is shown as containing two increment shift stages. However, it should be understood that the typical practical embodiment will contain a total of 4 or 5 such stages in order to enable selection of phase shift angle with fine resolution.

180° phase shift stage 16 is comprised of two parallel electrical circuit paths between an input junction point 20 and an output junction point 22. The left-hand (as appears on the drawing) path is the 180° phase shift path 24 comprised of a diode 26, the collector-to-emitter internal circuit of a low frequency transistor 28, a microstrip transmission line section 30 having an electrical length of 180° at the R.F. frequency, and another diode 32. The right-hand path is the zero-shift path 34 comprised of a diode 36, the collector-emitter internal circuit of a low frequency transistor 38, and a diode 40. The binary control signals for stage 16, which consists of the regular binary voltage signal $BIT_{180}$, and the complemented binary voltage signal $\overline{BIT}_{180}$, are applied to the bases of transistors 28 and 38, respectively, via suitable driver stages 42 and 44. Driver stage 42 is so constructed that when the signal $BIT_{180}$ is in its HIGH state, the base of transistor 28 will be essentially grounded, causing saturation conduction in the collector-emitter internal circuit thereof. When signal $BIT_{180}$ is in its LOW state, a positive polarity voltage is applied to the phase of transistor 28 causing the collector-emitter internal circuit of the latter to be open circuited. Driver stage 44 applies signal $\overline{BIT}_{180}$ to the base of transistor 38 in a like manner. Both driver stages 42 and 44 are coupled to the respective bases through R.F. decoupling impedances 46 and 48, respectively.

90° phase shift stage 18 is identical to stage 16 except that the transmission line section 50 in its phase shift path has an electrical length of 90°. Because of this the identical components thereof have been given the same reference numerals as their counterparts in 180° shift stage 16, but with a postscript "a".

Diodes 26, 32, 36, 40, 26a, 32a, 36a and 40a are all poled such that their forward direction of conduction is from input terminal 12 to output terminal 14. Similarly, the polarity type of transistors 24, 34, 24a, and 34a and the poling of their respective collector-emitter internal circuit paths are so chosen for forward conduction in the direction from input terminal 12 to output terminal 14. For exemplary purposes it will be assumed that the voltage drop across each diode is 0.7 volts and the voltage drop across the collector-emitter path of each transistor is also 0.7 volts. A positive diode forward conduction bias voltage E+ of a magnitude sufficient to provide the aggregate of the diode and transistor drops is introduced into network 10 at a circuit junction point 52 via an R.F. choke 54. This D.C. bias potential is coupled to a ground return at a circuit junction point 56 via another R.F. choke coil 58.

Diodes 26, 32, 36, 40, 26a, 36a and 40a are conventional R.F. diodes. Transistors 28, 38, 28a, and 38a are conventional pnp-type low frequency transistors such as Style No. 2N2909 available from a number of major transistor manufacturers. Network 10 is made of conventional high density packaging employing microstrip delay lines, and diode and transistor chips mounted directly upon the microstrip structure in a way which permits a construction with all connections of essentially zero electrical length at R.F., except where the delay line sections 30 and 50 are in the circuit.

As a matter of design choice, R.F. decoupling impedances 46, 48, 46a, and 48a may be either R.F. choke coils or resistors. By using choke coils, maximum decoupling of the R.F. signal out through the driver stages is achieved, but the resulting circuit construction must be implemented by the attachment of the R.F. coils, which makes high density packaging of circuit 10 difficult. However, it is a feature of the present invention that a very small amount of control current is required between the respective driver stage and the base of the respective transistor, and therefore it is possible to use resistive lines or discrete resistors to provide the desired isolation of the R.F. and D.C. networks. Use of resistive lines or discrete resistors further makes the network amenable to high density packaging. Also, it should be noted that what makes resistor elements usable is that the D.C. current gain of the transistor offsets the D.C. loss incurred by the use of the resistor, which will have a value which is large compared with the characteristic impedance of the transmission line.

In the operation of network 10 the digital bit signals can selectively control the configuration of paths from R.F. input terminal 12 to R.F. output terminal 14 to provide any combination of 0°, 90°, 180°, 270° phase shift. For example, to provide a 90° phase shift a binary control signal combination of $BIT_{180}$ = LOW, $\overline{BIT}_{180}$ = HIGH, $BIT_{90}$ = HIGH, and $\overline{BIT}_{90}$ = LOW would be applied. In shift stage 16, the application of a LOW $BIT_{180}$ signal to driver stage 42 causes the collector-emitter internal circuit of transistor 28 to be open circuited, so that no forward conduction is possible to diodes 26 and 32. Conversely, the HIGH $\overline{BIT}_{180}$ signal to driver stage 48 drives transistor 38 into saturation conduction through its collector-emitter internal path and the forward biased diodes 36 and 40 conduct the R.F. signal through zero shift path 34. In increment shift stage 18 the HIGH $BIT_{180}$ signal causes the R.F. signal to travel through the 90° phase shift transmission line 50 and the LOW $\overline{BIT}_{90}$ causes zero shift path 34a to be open. It is to be appreciated that a key factor in the effective operation of network 10 is that the transistors when driven into saturation exhibit an extremely low collector-to-emitter R.F. loss, and therefore can be placed directly in the R.F. path.

It will be appreciated that several of the details of construction of network 10 are only one way in which an effective network may be implemented. The locations of the transistor and transmission line in the 180° paths 24, 24a could be reversed. The D.C. bias potential, and the corresponding forward conduction polarity of the diodes and the collector-emitter internal circuits of transistors need not run in the same direction as the R.F. flow. The transistors could be of the npn polarity type, provided that the polarity of diodes is changed to have a corresponding forward conduction direction.

An important advantage of the invention is the D.C. power savings. Using the previous exemplary voltage drops of 0.7 volts for both transistors and diodes, the E+ power supply for a network having an average number of conducting diodes = 10 would be equal to or greater than 10.5 volts. Using the same method of calculation as earlier described herein, the power source required for such a circuit would be 1.05 watts or a saving of almost 80% over the described prior art parallel drive approach.

Another important feature is the simplicity of the R.F. circuit. Only two bias lines are connected directly to the R.F. path, and no series capacitors are necessary between increment shift stages. In addition, the amount of decoupling between the R.F. path and the control lines which drive the transistors is very small. The end result is that the construction yields a very low insertion loss. Further, because of the lack of frequency-sensitive elements, the circuit design is capable of wideband operation. These results have been experimentally verified, and the insertion loss of a transistor stage has been determined to be significantly less than 0.1 db. The 0.1 db amount has been found to be that of the circuit elements required with the prior art approach of separate forward biased drivers for individual diodes, or for sets of several diodes, which are no longer necessary in the present configuration.

We claim:

1. A diode switched variable R.F. phase shift network of the type in which shift increment stages may be controllably inserted in series circuits in the network in response to normal and complemented forms of binary digit signals, said phase shift network comprising:
   a. at least first and second phase shift stages, all serially connected between first and second network ends,
   b. each phase shift stage comprising a zero-shift path and a phase shift path in parallel circuit relationship with one another, the zero-shift path and the phase shift path each having an associated transistor,
   c. the zero-shift path of each phase shift stage including one and another diodes and the collector-emitter path of the associated transistor therebetween, all connected in series circuit, d. The phase shift path of phase shift stage including one and another diodes and a sub-network of two series connected circuit elements therebetween, all connected in series circuit, said sub-network including one and another of the collector-emitter path of the associated transistor and an R.F. delay line element, e. the diodes in the paths of the phase shift stages having a common polarity of forward conduction relative to the first and second network ends, and means for applying a bias potential between said first and second network ends, said bias potential being poled in the direction of forward conduction of the diodes, f. means for applying the normal and complemented forms, respectively, of each binary digit signal to the bases of the transistors associated with one and the other paths of the corresponding phase shift stage.

2. Apparatus in accordance with claim 1, wherein;

a. the binary digit signals are applied to the bases of the transistors through an R.F. decoupling impedance element.

3. Apparatus in accordance with claim 2, wherein;

a. the R.F. decoupling impedance elements through which binary digit signals are applied to the bases of the transistors are inductances.

4. Apparatus in accordance with claim 2, wherein; a. the R.F. decoupling impedance elements through which the binary digit signals are applied to the bases of the transistors are resistors.

5. A phase shifter in which control signals determine the configuration of current paths between an input terminal and an output terminal to selectively provide a predetermined shift in the phase angle of an input signal, said phase shifter comprising:

a first pair of commonly poled diodes serially arranged in a first current path;

first means for electrically coupling the diodes of said first diode pair to selective conduct said input signal through said first current path in response to a first control signal;

a second pair of commonly poled diodes serially arranged in a second current path second means for electrically coupling the diodes of said second diode pair to selectively conduct said input signal through said second current path in response to the complement of said first control signal; and means for shifting the phase of said input signal by a predetermined angle when said input signal is conducted through said second current path in response to said second coupling means.

6. The phase shifter of claim 5 further comprising: means for forward biasing said first and second pairs of diodes for conduction of the input signal in response to the closing of said first and second coupling means respectively.

7. The phase shifter of claim 5 wherein said first coupling means comprises a first transistor included in the first current path, said first transistor having a collector connected to one diode of said first diode pair and having an emitter connected to the other diode of said first diode pair;

and wherein said second coupling means comprises a second transistor included in the second current path, said second transistor having a collector connected to one diode of said second diode pair and having an emitter connected to said shifting means.

8. The phase shifter of claim 5 wherein said first coupling means comprises a first transistor included in the first current path, said first transistor having a collector connected to one diode of said first diode pair and having an emitter connected to the other diode of said first diode pair; and wherein said second coupling means comprises a second transistor included in the second current path, said second transistor having an emitter connected to one diode of said second diode pair and having a collector connected to said shifting means.

9. The phase shifter of claim 7 wherein said transistor included in the first and second current paths are low-frequency transistors that exhibit a low collector-to-emitter loss when driven into saturation.

10. The phase shifter of claim 7 wherein said first coupling means further includes a first impedance for biasing the base of said first transistor in response to said control signal, and wherein said second coupling means further includes a second impedance for biasing the base of said second transistor in response to the complement of said control signal.

11. The phase shifter of claim 10 wherein said first and second impedances comprise first and second resistors respectively.

12. The phase shifter of claim 10 wherein the emitters of said first and second transistors are responsive to the output of the cathodes of one diode of said first and second diode pairs respectively.

13. The phase shifter of claim 12 wherein the anode of the other diode of said first diode pair is responsive to the output of the collector of said first transistor.

14. The phase shifter of claim 12 wherein said shifting means is responsive to the output of the collector of said second transistor.

15. The phase shifter of claim 14 wherein the anode of the other diode of said second diode pair is responsive to the output of said shifting means.

16. The phase shifter of claim 10 wherein said shifting means is responsive to the output of the cathode of one diode of said second diode pair.

17. The phase shifter of claim 16 wherein said second transistor is responsive to the output of said shifting means.

18. The phase shifter of claim 17 wherein the emitter of said second transistor is responsive to said shifting means and wherein the anode of the other diode of said second diode pair is responsive to the output of the collector of said second transistor.

* * * * *